United States Patent
Matus et al.

(10) Patent No.: US 11,309,484 B2
(45) Date of Patent: Apr. 19, 2022

(54) PVDF PIEZOELECTRIC RELIABILITY AND ELECTRODE ADHESION IMPROVEMENT

(71) Applicant: Littelfuse, Inc., Chicago, IL (US)

(72) Inventors: Yuriy B. Matus, Pleasanton, CA (US); Martin Pineda, Fremont, CA (US); Edward W. Rutter, Jr., Pleasanton, CA (US)

(73) Assignee: Littelfuse, Inc., Chicago, IL (US)

( * ) Notice: Subject to any disclaimer, the term of this patent is extended or adjusted under 35 U.S.C. 154(b) by 661 days.

(21) Appl. No.: 16/246,521

(22) Filed: Jan. 13, 2019

(65) Prior Publication Data
US 2020/0227622 A1   Jul. 16, 2020

(51) Int. Cl.
| | | |
|---|---|---|
| *H01L 41/193* | (2006.01) | |
| *H01L 41/047* | (2006.01) | |
| *H01L 41/27* | (2013.01) | |
| *H01L 41/08* | (2006.01) | |
| *H01L 41/083* | (2006.01) | |

(52) U.S. Cl.
CPC ........ *H01L 41/193* (2013.01); *H01L 41/0472* (2013.01); *H01L 41/083* (2013.01); *H01L 41/0805* (2013.01); *H01L 41/27* (2013.01)

(58) Field of Classification Search
CPC .............. H01L 41/193; H01L 41/0472; H01L 41/0805; H01L 41/083
See application file for complete search history.

(56) References Cited

U.S. PATENT DOCUMENTS

| | | | |
|---|---|---|---|
| 2015/0325228 A1* | 11/2015 | Choi | H01L 41/45 367/140 |
| 2016/0284978 A1* | 9/2016 | Aliane | H01L 41/45 |
| 2018/0040806 A1* | 2/2018 | Gong | H01L 41/0477 |
| 2018/0269374 A1* | 9/2018 | Numazawa | H01L 41/1871 |
| 2018/0375445 A1* | 12/2018 | Oya | H01L 41/0986 |

FOREIGN PATENT DOCUMENTS

CN     1092918 A  *  9/1994  ........... G06F 3/0436

* cited by examiner

*Primary Examiner* — J. San Martin
(74) *Attorney, Agent, or Firm* — Kacvinsky Daisak Bluni PLLC

(57) ABSTRACT

A device may include an inner layer comprising a polyvinylidene fluoride (PVDF) material. The device may also include a first interface layer, disposed on a first side of the inner layer, and a second interface layer, disposed on a second side of the inner layer. The first interface layer and the second interface layer may comprise a mixture of PVDF material and a scavenger component.

18 Claims, 3 Drawing Sheets

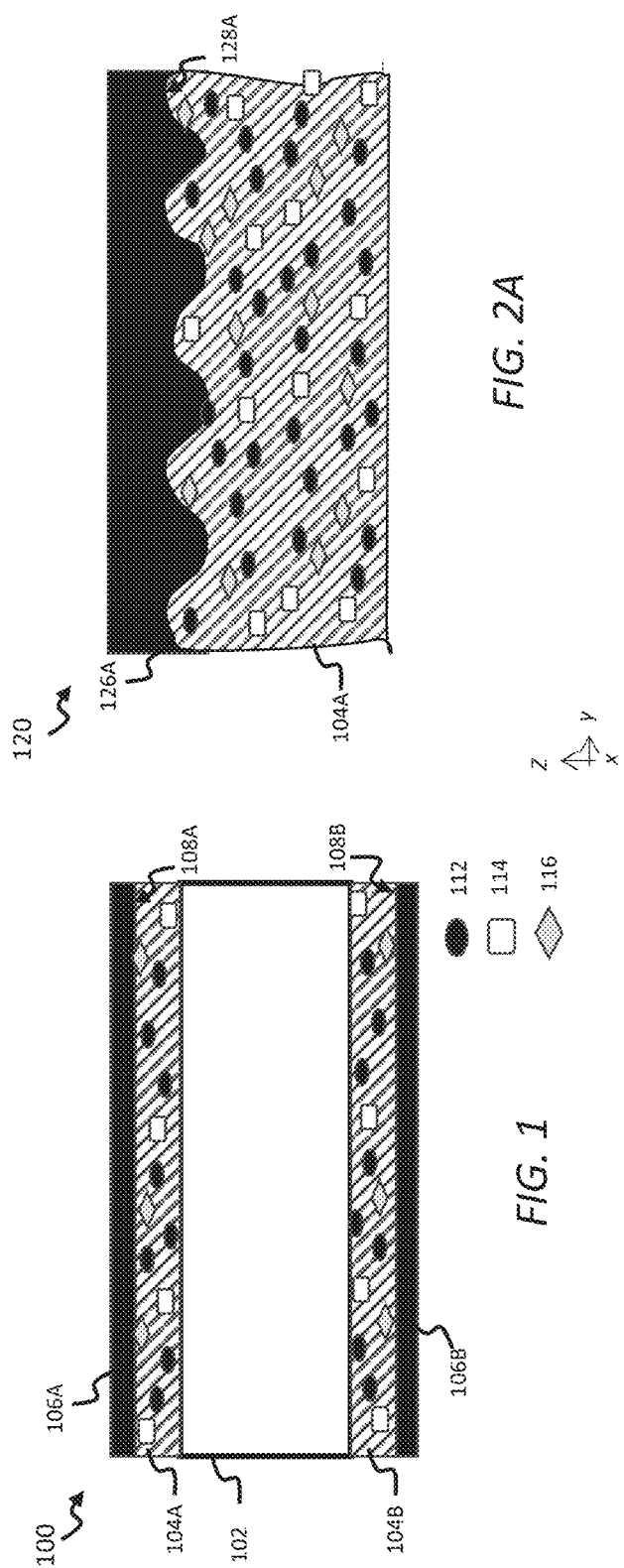

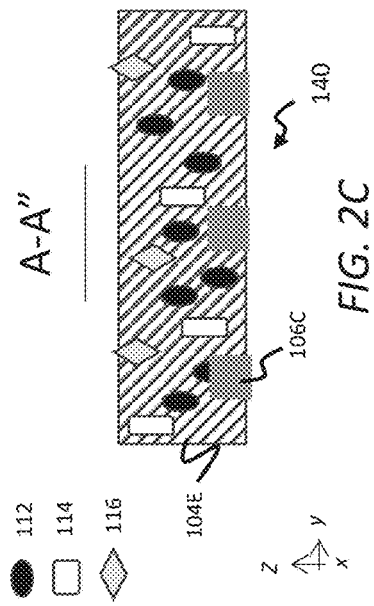
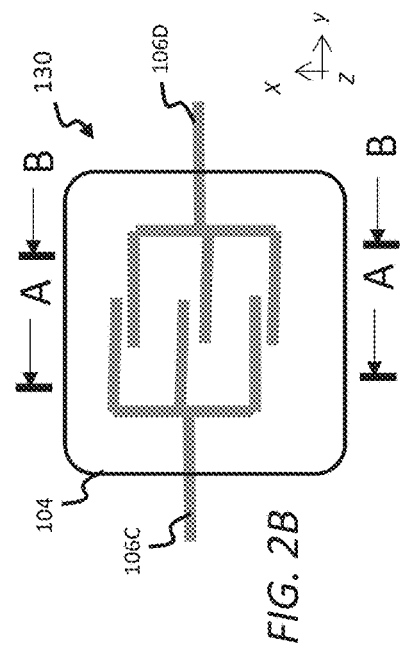
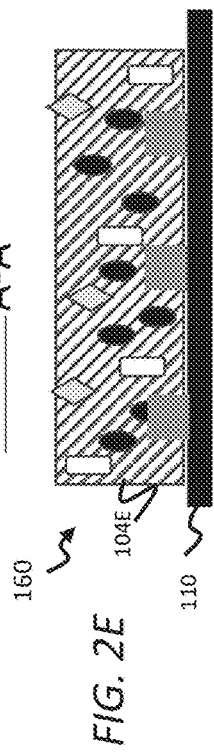
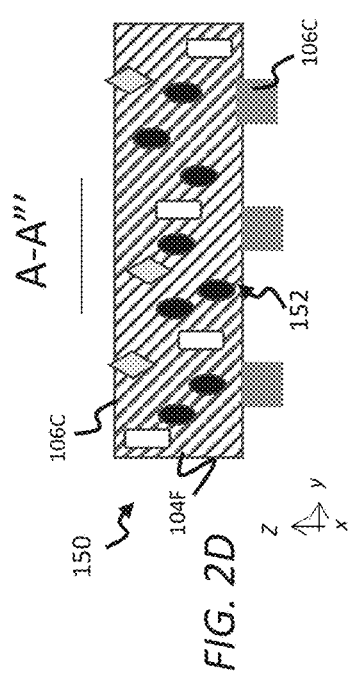
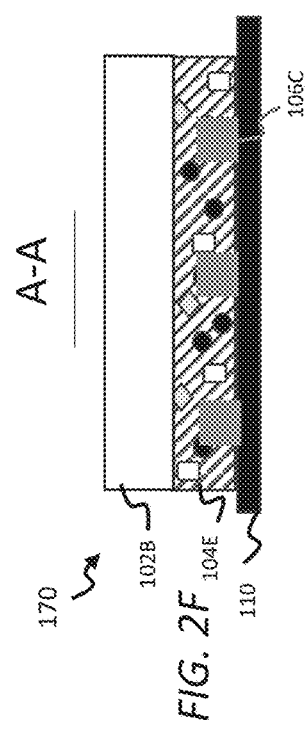

PVDF PIEZOELECTRIC RELIABILITY AND ELECTRODE ADHESION IMPROVEMENT

BACKGROUND

Field

Embodiments relate to the field of piezoelectric devices, an in particular to piezoelectric devices based on polyvinylidene fluoride.

Discussion of Related Art

Polyvinylidene fluoride (PVDF) has long been recognized for the superior piezo-electric properties as well as other excellent electrical properties. PVDF may be formed as a bulk material or thin sheet for forming a piezoelectric device. One recognized drawback of PVDF devices is the electrical fatigue that is observed upon during operation of PVDF devices. A manifestation of electrical fatigue is the decrease in polarization of the PVDF device upon repeated cycling of an electric field applied across the PVDF device. The electrical fatigue may accordingly limit the lifetime of such PVDF devices.

In view of the above, the present embodiments are provided.

BRIEF SUMMARY

In one embodiment, a device is provided. The device may include an inner layer comprising a polyvinylidene fluoride (PVDF) material; a first interface layer, disposed on a first side of the inner layer; and a second interface layer, disposed on a second side of the inner layer, wherein the first interface layer and the second interface layer comprise a mixture of PVDF material and a scavenger component.

In another embodiment, a method of forming a piezoelectric device may include providing an inner layer comprising a polyvinylidene fluoride (PVDF) material; depositing a first coating on a first side of the inner layer; depositing a second coating on a second side of the inner layer, opposite the first layer, the first coating and the second coating comprising a scavenger component.

In an additional embodiment, a device is provided, wherein the device may include an altered layer, comprising a mixture of a piezoelectric polymer material, a scavenger component, and an antioxidant. The device may include a first electrode assembly, disposed on a first surface of the altered layer; and a second electrode assembly, disposed on the first surface of the altered layer, wherein the first electrode assembly, and the second electrode assembly are interdigitated with one another.

BRIEF DESCRIPTION OF THE DRAWINGS

FIG. 1 shows a PVDF device arranged according to some embodiments of the disclosure;

FIG. 2A shows a close-up cross-sectional view of a piezoelectric device, in accordance with embodiments of the disclosure;

FIG. 2B shows a top plan view of another piezoelectric device, in accordance with embodiments of the disclosure;

FIG. 2C shows a close-up cross-sectional view of a further piezoelectric device, in accordance with embodiments of the disclosure;

FIG. 2D shows a close-up cross-sectional view of an additional piezoelectric device, in accordance with embodiments of the disclosure;

FIG. 2E shows a close-up cross-sectional view of a still further piezoelectric device, in accordance with embodiments of the disclosure;

FIG. 2F shows a close-up cross-sectional view of yet another piezoelectric device, in accordance with embodiments of the disclosure.

DESCRIPTION OF EMBODIMENTS

Figure 3:
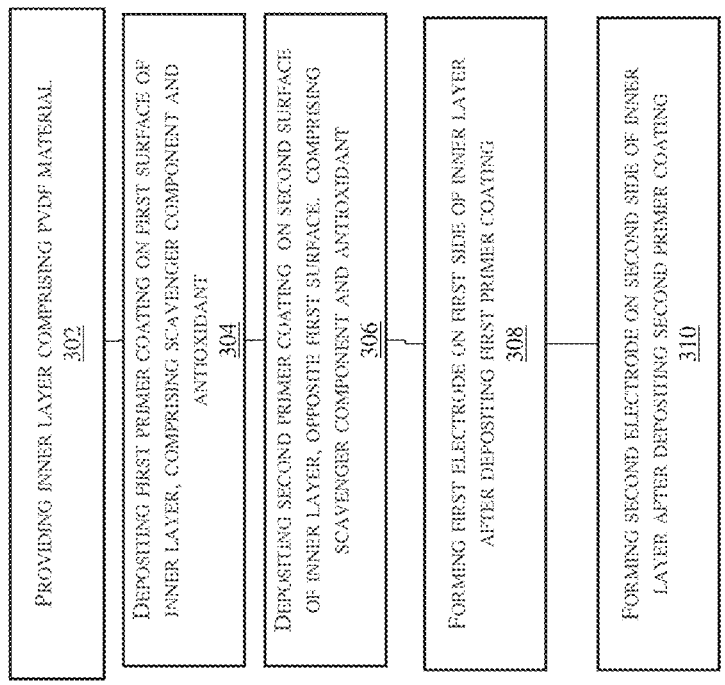
FIG. 3 presents an exemplary process flow, according to embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

In various embodiments, improved PVDF devices and methods of formation are provided. As used herein, unless otherwise noted, the term "PVDF material" may refer to the homopolymer PVDF based upon vinylindene fluoride monomer, copolymers of PVDF, such as copolymers made from vinylidene fluoride and trifluoroethylene, or from PVDF and tetrafluoroethylene; terpolymers of PVDF, mixed with monochloro-trifluoroethylene and other monomers, and so forth. Generally, the "PVDF material" of the present embodiments is piezoelectric in nature and includes a substantial fraction of vinylidene fluoride monomer building blocks.

In accordance with various embodiments of the disclosure, various components may be added to a PVDF device, including within a PVDF layer, in additional layers, or at interfaces between layers. Turning to FIG. 1 there is shown a device 100, according to embodiments of the disclosure. The device 100 may include an inner layer 102, where the inner layer 102 comprises a piezoelectric material based on a PVDF material. The inner layer 102 may be arranged as a bulk material having a first thickness on the order of millimeters (in the Z-direction) in some embodiments, or a thin sheet or layer in other embodiments, having a first thickness on the order of tens of micrometers. The embodiments are not limited in this context.

As further shown in FIG. 1, the device 100 may further include a first interface layer 104A, disposed on a first side of the inner layer 012, and a second interface layer 104B, disposed on a second side of the inner layer 102, wherein the first interface layer 104A and the second interface layer 104B comprise a mixture of PVDF material and a scavenger component 112. Generally, the first interface layer 104A may have a second thickness, and the second interface layer 104B may have a third thickness, where the second thickness and third thickness are less than the first thickness. In some examples, the second thickness may be equal to the third thickness. As an example, the first thickness may be in the range of 20 µm to 25 µm, while the second thickness and the third thickness may be in the range of 1 µm to 5 µm.

In other embodiments, the inner layer 102 may have a thickness of 10 um to 50 um, and where the first interface layer 104A and the second interface layer 104B have an interface layer thickness of 1 µm to 15 µm, where the interface layer thickness is less than the thickness of the inner layer.

As further shown in FIG. 1, the device 100 may include a first electrode 106A, adjacent the first interface layer 104A, and a second electrode 106B, adjacent the second interface layer 104B, where the first electrode 106A and the first interface layer 104A define a first electrode interface 108A, and where the second electrode 106B and the second interface layer 104B define a second electrode interface 108B.

In accordance with various non-limiting embodiments, the scavenger component 112 may be formed of an oxide, a carbonate, a hydroxide, an amine, or any combination thereof. In specific embodiments, the oxide, the carbonate, the hydroxide, or the amine, or any combination thereof may be based upon calcium, magnesium, or zinc, or any combination thereof. The embodiments are not limited in this context. One feature of the scavenger component 112 is to scavenge breakdown products of the PVDF material, occurring when the PVDF device is cycled in electric fields. The elimination of hydrofluoric acid (HF) from certain polymers is believed to be a common breakdown mechanism, such as in positive temperature coefficient devices. Because fatigue may be embodied as a decreased polarization response when subject to a given electric field, in a piezoelectric material, the mechanical deformation with applied electric field may decrease in a piezoelectric device subject to fatigue. Accordingly, by providing scavengers in the first interface layer 104A and the second interface layer 104B, at least some products generated in the device 100 may be absorbed by the scavengers. For example, the scavenger components 112 may react with decomposition products to trap HF. Without limitation as to a particular theory, the present inventors have recognized that placement of scavengers just near the first electrode interface 108A and/or the second electrode interface 108B may be especially effective in addressing the problem of HF generation, since HF evolution may be more deleterious to fatigue at such interfaces, as opposed to in the inner layer 102.

According to further embodiments of the disclosure, the first interface layer 104A and the second interface layer 104B may further comprise an antioxidant 114. Examples of suitable materials for use as anti-oxidants include Agerite® MA (Polymerized 1,2-dihydro-2,2,4-trimethylquinoline), ZMTI (zinc 2-Mercaptotoluimidazole), MTI (2-Mercaptotoluimidazole), a phosphite (compound that has phosphorus bound to three alkoxide groups i.e. P(OR)3), a thiodipropionate ester, a phenolic antioxidant, Irganox®565, Irganox®1010 (Irganox 1010 and Irganox 565 are phenolic antioxidants; Irganox 565 contains sulfur as well) or any combination thereof. The embodiments are not limited in this context. These materials or other known antioxidants react with products such as HF to prevent or mitigate deleterious attack at an electrode, which attack may result in delamination, electrical fatigue, and other degradation of the device 100.

In further embodiments of the disclosure, an adhesion promoter 116 may be provided in the first interface layer 104A and the second interface layer 104B. As such, adhesion between the first interface layer 104A and the first electrode 106A may be promoted at the first electrode interface 108A. Similarly, adhesion between the second interface layer 104B and the second electrode 106B may be promoted at the second electrode interface 108B. Suitable materials for adhesion promoter 116 include a maleic-acid-containing material or other carboxylic acid or salts thereof. The embodiments are not limited in this context.

Turning to FIG. 2A there is shown a close up of a portion of a device 120, illustrating the first interface layer 104A and a first electrode 126A provided in contact with the first interface layer 104A. The device 120 may include a similar second interface layer and second electrode on an opposite side, as generally described above with respect to FIG. 1. In this embodiment, the first interface layer 104A and the first electrode 126A define a first electrode interface 128A, where the where the first electrode interface 128A is characterized by a roughness. According to some embodiments, the roughness may be characterized by a peak-to-valley dimension along the Z-axis of the Cartesian coordinate system shown. In some cases, this first roughness may be less than the thickness of the first interface layer 104A. In some cases, this first roughness may be less than the thickness of the first interface layer 104A. Similarly, a second roughness of a second electrode interface between a second interface layer and second electrode may also be less than the thickness of the second interface layer. In some embodiments, the first roughness and the second roughness may be greater than 0.1 um and may range up to 50 microns in dimension. In particular embodiments, the roughness may range between 1-25 microns for overall film thickness greater than 25 microns, while the roughness may range between 1-5 microns for overall film thickness 25 microns or less.

In accordance with various embodiments of the disclosure a piezoelectric device may be formed by depositing coatings on opposite sides of an inner layer. According to various embodiments, a PVDF layer to serve as an inner layer may be formed according to known techniques including thick film techniques or thin film techniques. Suitable examples of techniques for forming an inner layer containing a PVDF material include tape casting, screen printing, spin coating, spray deposition, electrophoretic deposition, pad printing on flexible of rigid substrates, extrusion, molding, or any combination thereof. As noted, in various embodiments, the inner layer may include a PVDF material, without a scavenger component or antioxidant, or adhesion promoter. As such, the inner layer may have piezoelectric properties characteristic of a pure PVDF material.

In various embodiments, a first interface layer and a second interface layer may be formed on opposite sides of an inner layer formed of pure PVDF material. In some embodiments, the first interface layer and second interface layer may be formed by depositing a first primer layer and a second primer layer on the opposite sides of the PVDF inner layer. As such, the primer layer may include a scavenger component, an antioxidant, or an adhesion promoter, or any combination thereof. After deposition of the primer layer, the first interface layer and the second interface layer may be formed in surface regions of the PVDF inner layer.

In other embodiments, a first electrode and a second electrode may be deposited in deposition operations, where additives including a scavenger, antioxidant, and/or adhesion promoter are included in the electrode material being deposited. As such, the additives may migrate into the inner layer to form a first interface layer and a second interface layer. According to further embodiments of the disclosure, a polling operation may be performed after forming a device structure, such as the device 100 or device 120. The polling may involve applying a potential from 500 to 10 kV with an electric field of 10V/μm to 100 V/μm using either corona or direct potential between electrodes for 1 min to 30 min of constant voltage, or applying a variable field polling where there is a change in applied voltage over time or hysteresis.

In accordance with additional embodiments of the disclosure, relatively low fractions of dielectric or conductive material may be added to an inner layer, or to an interface layer, or both. In particular embodiments, the additive may have a fibrous form, such as carbon black or various nanofibers of carbon, or dielectric or metal fibers, added in concentration below the percolation limit for conduction.

In various additional embodiments, electrodes may be deposited including nodules that generate a surface roughness, as shown, for example at FIG. 2A.

FIG. 2B shows a top plan view of another piezoelectric device, shown as device 130, in accordance with embodiments of the disclosure. The device 130 is shown in top plan view, where a layer 104 is shown, representing a piezoelectric material. The layer 104 may include for example, an interface layer arranged similarly to first interface layer 104A, as discussed above, and may additionally include a bulk material layer, arranged, for example, similarly to inner layer 102, described above. The device 130 may include a first electrode arrangement 106C and a second electrode arrangement 106D, where the first electrode arrangement 106C and the second electrode arrangement 106D are disposed on the same side of the layer 104, and form an interdigitated electrode arrangement, as shown in FIG. 2B.

FIGS. 2C-2F depict variants of the device 130 according to additional embodiments, shown along the cut A-A of FIG. 2B. Turning to FIG. FIG. 2C there is shown a close-up cross-sectional view of another piezoelectric device, shown as device 140, in accordance with embodiments of the disclosure. In this embodiment, the first electrode arrangement 106C is shown, as indicated by the section A-A of FIG. 2B. A similar structure as depicted in FIG. 2C may be encountered for a cut B-B, and is not shown for brevity. As shown in FIG. 2C, the interdigitated structure of the first electrode arrangement 106C (the same applies for second electrode arrangement 106D) is formed in a manner where the first electrode arrangement 106C is at least partially embedded an altered layer 104E. The altered layer 104E may be formed of a PVDF material with added components as generally described above with respect to FIG. 1 and FIG. 2A. In this embodiment, no region of bulk PVDF material, without additives is present.

FIG. 2D shows a close-up cross-sectional view of an additional piezoelectric device, in accordance with embodiments of the disclosure, shown as device 150. In this embodiment, the overall arrangement is similar to FIG. 2C, while the first electrode arrangement 106C (and second electrode arrangement 106D) are arranged on the surface 152 of an altered layer 104F, having similar components as altered layer 104E, without the electrode arrangements being embedded within the altered layer 104F. Thus, the altered layer 104E, such as a PVDF-based composite material, acts as a substrate, which substrate is contacted by the first electrode arrangement 106C and the second electrode arrangement 106D. Again, no region of unaltered piezoelectric material is present in the device 150, such as pure PVDF.

FIG. 2E shows a close-up cross-sectional view of a still further piezoelectric device, in accordance with embodiments of the disclosure, shown as device 160. The device 160 is similar to the device 140, differing from the device 140, in that the various components including the altered layer 104E are disposed on a substrate 110. Examples of a suitable substrate material include but are not limited to: polyesters such as poly(ethylene terephthalate) and analogues) PET, polyimide (PI), poly(ethylene napthalenate) PEN, PU (polyurethane), silicone elastomers, polysulfone PS, Liquid crystal polymer (LCP), poly(acrylonitrile) and flurorpolymers, glass or ceramic substrates.

FIG. 2F shows a close-up cross-sectional view of yet another piezoelectric device, in accordance with embodiments of the disclosure, shown as device 170. In this embodiment, the device 170 includes the altered layer 104E, where an overlayer 102B is disposed on a first surface of the altered layer 104E, as shown. A second surface of the altered layer 104E, opposite the first surface, is disposed on the substrate 110.

While the embodiments of FIGS. 2B-2F illustrate altered layers having a scavenger component, an antioxidant, and an adhesion promoter, in further embodiments, the altered layer of devices having analogous structure to the devices depicted in FIGS. 2B-2F may include just one of these three components, or just two of these components, in any combination. Notably, in various embodiments as reflected in FIGS. 2b-2F, each of the layers shown may have a thickness of 5 microns or greater, and in some cases 12.5 microns or greater.

Turning now to FIG. 3 there is shown a process flow 300, in accordance with various embodiments of the disclosure. At block 302 an inner layer is provided, formed of a PVDF material. The inner layer may be poled in some examples. The inner layer may have any thickness suitable for use as a piezoelectric device, such as from centimeter-scale thickness to micrometer scale thickness. In some embodiments, the inner layer may constitute a component having a sheet-like shape, where the thickness of the inner layer is relatively small compared to the width and length of the inner layer. In other embodiments, the inner layer may have a more block-like shape, where the dimensions are comparable along three mutually orthogonal directions, such as a cube, or rectangular block.

At block 304, a first primer coating is deposited on a first surface of the inner layer. The first primer coating may contain a scavenger component, as well as an antioxidant. In some embodiments, the first primer coating may further include an adhesion promoter.

At block 306 a second primer coating is deposited on a second surface of the inner layer, where the second surface is opposite the first surface. The second primer coating may contain a scavenger component, as well as an antioxidant. In some embodiments, the second primer coating may further include an adhesion promoter.

According to various embodiments, the first primer coating and the second primer coating may be applied to the first surface and the second surface of the inner layer at the same time in a common operation.

At block 308, a first electrode is formed on the first side of the inner layer after the depositing of the first primer coating.

At block 310, a second electrode is formed on the second side of the inner layer after the depositing of the second primer coating. In one variant, where a PVDF device is formed on a substrate, an additive process may be performed, where conductive material is formed just on an area of interest of the substrate. In another variant where a PVDF device is formed on a substrate, a subtractive process may be performed. In this variant, conductive material is deposited as a blanket film on the substrate and regions are etched to produce a desired pattern, where the etching may be performed using photolithography or other masking approaches, or a direct laser ablation process.

According to some embodiments, the first electrode and the second electrode may be formed in a common operation at the same time. As such, after the formation of the first electrode and the second electrode, the device thus formed may constitute a robust piezoelectric device having an inner layer formed of PVDF and a first interface layer and second interface layer, opposite the first interface layer, disposed between the inner layer and the first electrode and second electrode, respectively. The first interface layer and the second interface layer may include a mixture of PVDF, scavenger, antioxidant, as well as adhesion promoter in some embodiments.

In summary, the present embodiments provide various advantages over known piezoelectric devices. For one, by providing an interface layer having additives such as scavengers and antioxidants, the deleterious effects of HF evolution during cycling in electric fields may be avoided or reduced. These effects that are eliminated may include formation of cracks due to evolution of HF bubbles, as well as delamination, in addition to the general fatigue, as evidenced by reduced response in a given electric field.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A device, comprising:
    an inner layer comprising a polyvinylidene fluoride (PVDF) material;
    a first interface layer, disposed on a first side of the inner layer;
    a second interface layer, disposed on a second side of the inner layer, wherein the first interface layer and the second interface layer comprise a mixture of PVDF material and a scavenger component; and
    a first electrode, adjacent the first interface layer, and a second electrode, adjacent the second interface layer, wherein the first electrode and the first interface layer define a first electrode interface, wherein the second electrode and the second interface layer define a second electrode interface, wherein the first electrode interface and the second electrode interface comprise a first roughness and a second roughness, the first roughness and the second roughness being less than a thickness of the first interface layer and a thickness of the second interface layer, respectively, and being greater than 0.1 µm and less than 25 µm.

2. The device of claim 1, wherein the inner layer comprises a first thickness, wherein the first interface layer comprises a second thickness, and the second interface layer comprise a third thickness, the second thickness and the third thickness being less than the first thickness.

3. The device of claim 1, wherein the inner layer comprises a thickness of 10 µm to 50 µm, and wherein the first interface layer and the second interface layer comprise an interface layer thickness of 1 µm to 15 µm.

4. The device of claim 1, wherein the scavenger component comprises at least one of an oxide, a carbonate, a hydroxide, and an amine, wherein the oxide, the carbonate, the hydroxide, or the amine comprises at least one of calcium, magnesium, and zinc.

5. The device of claim 1, wherein the first interface layer and the second interface layer further comprise an antioxidant.

6. The device of claim 5, wherein the antioxidant comprises at least one of Agerite, MA, ZMTI, MTI, a phosphite, a thiodipropionate ester, a phenolic antioxidant, Irganox 565, and Irganox 1010.

7. The device of claim 1, wherein the first interface layer and the second interface layer further comprise an adhesion promoter.

8. The device of claim 7, wherein the adhesion promotor comprises a maleic-acid-containing material or other carboxylic acid or salts thereof.

9. The device of claim 1, wherein the device comprises an interdigitated electrode arrangement, disposed on a first surface of the inner layer.

10. A method of forming a piezo-electric device, comprising:
    providing an inner layer comprising a polyvinylidene fluoride (PVDF) material;
    depositing a first coating on a first side of the inner layer;
    depositing a second coating on a second side of the inner layer, opposite the first layer, the first coating and the second coating comprising a scavenger component
    depositing a first electrode adjacent the first coating; and
    depositing a second electrode adjacent the second coating;
    wherein the first electrode and the first coating define a first electrode interface, wherein the second electrode and the second coating define a second electrode interface, wherein the first electrode interface and the second electrode interface comprise a first roughness and a second roughness, the first roughness and the second roughness being less than a thickness of the first coating and a thickness of the second coating, respectively, and being greater than 0.1 µm and less than 25 µm.

11. The method of claim 10, wherein the first coating forms a first interface layer on the first side and the second coating forms a second interface layer on the second side, wherein the first interface layer and the second interface layer comprise a mixture of PVDF material and the scavenger component.

12. The method of claim 10, wherein the scavenger component comprises at least one of an oxide, a carbonate, a hydroxide, and an amine, wherein the amine, the carbonate, the hydroxide, or the amine comprises at least one of calcium, magnesium, and zinc.

13. The method of claim 11, wherein the first coating the second coating further comprise an antioxidant, and wherein the first interface layer and the second interface layer comprise a mixture of PVDF material, the scavenger component, and the antioxidant.

14. The method of claim 13, wherein the antioxidant comprises at least one of Agerite, MA, ZMTI, MTI, a phosphite, a thiodipropionate ester, a phenolic antioxidant, Irganox 565, and Irganox 1010.

15. The method of claim 13, wherein the first coating and the second coating further comprise, an adhesion-promoter, and wherein the first interface layer and the second interface layer comprise a mixture of PVDF material, the scavenger component, the antioxidant, and the adhesion promoter.

16. The method of claim 11, wherein the first coating and the second coating comprise an electrode material, wherein after the depositing the first coating and the depositing the second coating, a device structure is formed, comprising:
the inner layer, the first interface layer, the second interface layer, a first electrode, disposed adjacent the first interface layer, and a second interface layer, disposed adjacent the second interface layer.

17. The method of claim 10, wherein the inner layer comprises a thickness of 10 µm to 50 µm, and wherein the first coating and the second coating form a first interface layer and a second interface layer within the inner layer.

18. The method of claim 16, wherein the first interface layer and the second interface layer comprise an interface layer thickness of 1 µm to 15 µm.

\* \* \* \* \*